(12) United States Patent
Iwata et al.

(10) Patent No.: US 8,115,193 B2
(45) Date of Patent: Feb. 14, 2012

(54) VERTICAL RESONATOR TYPE LIGHT EMITTING DIODE

(75) Inventors: Masatoshi Iwata, Chiyoda-ku (JP); Ryo Sakamoto, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 101 days.

(21) Appl. No.: 12/770,590

(22) Filed: Apr. 29, 2010

(65) Prior Publication Data

US 2010/0301363 A1 Dec. 2, 2010

Related U.S. Application Data

(63) Continuation of application No. 12/280,551, filed as application No. PCT/JP2007/056347 on Mar. 27, 2007, now abandoned.

(30) Foreign Application Priority Data

Mar. 31, 2006 (JP) .................................. 2006-099183

(51) Int. Cl.
*H01L 29/06* (2006.01)

(52) U.S. Cl. ........................................... 257/14; 257/21

(58) Field of Classification Search .................... 257/14, 257/21

See application file for complete search history.

(56) References Cited

U.S. PATENT DOCUMENTS 5,324,964 A 6/1994 Ackley et al.
2002/0038869 A1 4/2002 Takaoka
2002/0134987 A1 9/2002 Takaoka

FOREIGN PATENT DOCUMENTS

| JP | 2002-111054 A | 4/2002 |
| JP | 2002-280602 A | 9/2002 |
| JP | 2003-332615 A | 11/2003 |
| JP | 2005-108880 A | 4/2005 |

OTHER PUBLICATIONS

International Search Report (ISR) for PCT/JP2007/056347 for Examiner consideration, citing U.S. Patent Application Publication Nos. 1-2 and Foreign Patent document Nos. 1-3 listed above.
Written Opinion (PCT/ISA/237) issued in PCT/JP2007/056347.

*Primary Examiner* — Samuel Gebremariam
(74) *Attorney, Agent, or Firm* — Chen Yoshimura LLP

(57) ABSTRACT

A novel vertical resonator type light emitting diode of which has a simplified structure of the reflector layer of its light emitting side an which is resistant to declination of its emission output power towards a high temperature range, has an active layer 5, and a first reflector layer 3 at its light reflecting side and a second reflector layer 9 at its light emitting side which are formed to sandwich the active later 5 between them, wherein each of the first reflector layer 3 and the second reflector layer 9 is structured to comprise a plurality of pairs of two alternate semiconductor layers formed which are different from each other in refractive index, and the second reflector layer 9 has a number of such pairs which is not less than 1/10 and not more than 1/3 of that which said first reflector layer 3 has. The emission output power can be enhanced when the first reflector layer has a number of such pairs which is not less than 11 and not more than 41.

6 Claims, 3 Drawing Sheets

VERTICAL RESONATOR TYPE LIGHT EMITTING DIODE

TECHNICAL FIELD

The present invention relates to a vertical resonator type light emitting diode for use in a light source for plastic optical fibers for example.

BACKGROUND ART

A light emitting diode that is low price than a laser diode has attracted attention as a light source for plastic optical fibers (POF). There becomes necessary a vertical resonator type light emitting diode having a resonator that causes light to resonate, since the conventional light emitting diode is unsatisfactory to achieve higher output power and more rapid responses.

A vertical resonator type light emitting diode has a structure that a double-heterostructure containing an active layer is sandwiched from its upper and lower sides between reflector layers to cause light from the active layer to resonate, constituting a vertical resonator whereby light emitted from the active layer is caused to resonate in directions vertical to the active layer. The reflector layer at each side comprise multiple pairs of Bragg reflector layers having high and low refractive index films alternately formed to increase their reflectance. The reflectances of the reflector layers are such that the reflectance of the reflector layer on the light emitting side is lower than that of the other side so that light emission at the active layer can be selectively emitted from the reflector layer.

Such a vertical resonator type light emitting diode is deemed to be used in a high temperature region of 100° C., and a vertical resonator type light emitting diode which has a small temperature dependence of emission output power has been required. Patent Reference 1 discloses a vertical resonator type light emitting diode in which the reflector layer at its light emitting side, namely at its front side has a plurality of reflection band characteristics to prevent its emission output power from falling in the high temperature region.

Patent Reference 1: Japanese laid open patent application, JP 2003-332615 A

DISCLOSURE OF THE INVENTION

Problems to be Solved by the Invention

As indicated in Patent Reference 1, however, the design of the reflector layer to have different reflection band characteristics is complicated. Further, as the reflector layer are formed of Bragg reflector layers in which the number of such pairs is 18 or more, there is the problem that it takes long time to grow the crystal in forming the reflector layers on the light emitting side.

With these problems borne in mind, it is an object of the present invention to provide a novel vertical resonator type light emitting diode which has a simplified structure of the resonator, especially of the reflector layer at its light emitting side and which is resistant to declination of its emission output power towards a high temperature range.

Means for Solving the Problems

As a result of conducting zealous investigations one after another, the present inventors have acquired the knowledge that in the structure of a vertical resonator type light emitting diode, if the reflector layer at its light emitting side has a pair number which is not less than $1/10$ and not more than $1/3$ of that which the reflector at its light reflecting side has, the temperature dependence of its emission output power is improved, and arrived at a completion of the present invention.

In order to achieve the object mentioned above, there is provided in accordance with the present invention a vertical resonator type light emitting diode having an active layer, and a first reflector layer at its light reflecting side and a second reflector layer at its light emitting side which are formed to sandwich the active later between them, characterized in that each of the first reflector layer and the second reflector layer is structured to comprise a plurality of pairs of two alternate semiconductor layers formed which are different from each other in refractive index, and that the second reflector layer has a number of such pairs which is not less than $1/10$ and not more than $1/3$ of that which the first reflector layer has.

According to this structure, since the number of such pairs for the first reflector layer be not less than $1/10$ and not more than $1/3$, a vertical resonator type light emitting diode, which has high emission output power even at room temperature and has its emission output power less temperature dependent, can be implemented.

In the structure mentioned above, the first reflector layer has a number of such pairs which preferably is not less than 11 and not more than 41. This preferred structure increases the reflectance of the first reflector layer, thereby providing a vertical resonator type light emitting diode of an increased emission output power.

Effects of the Invention

The present invention provides a vertical resonator type light emitting diode having a simplified structure of the reflector layer at its light emitting side and having a high emission output power less in its change on temperature.

Figure 1:
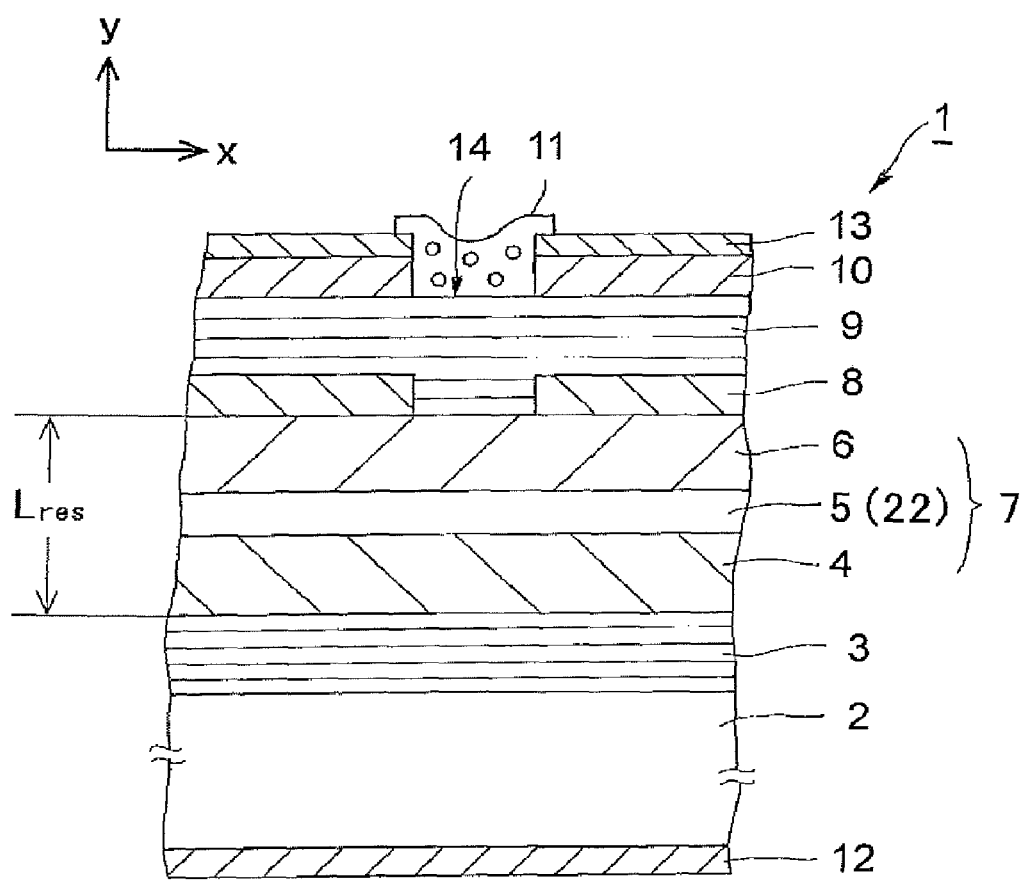
FIG. 1 is a cross sectional view illustrating a structure of a vertical resonator type light emitting diode according to the present invention.

| Description of Reference Numerals | |
|---|---|
| 1: | vertical resonator type light emitting diode |
| 2: | n-type substrate |
| 3: | first reflector layer of n type |
| 4: | first clad layer of n type |
| 5: | active layer |
| 6: | second clad layer of p type |
| 7: | double-heterostructure junction (light emitting area) |
| 8: | current blocking layer |
| 9: | second reflector layer of p type |
| 10: | electrode layer |
| 11: | passivation layer |
| 12,13: | electrode layer |
| 14: | light emitting area |
| 15: | dicing area |
| 18: | buffer layer |
| 22: | active layer of quantum well structure |

BEST MODES FOR CARRYING OUT THE INVENTION

An explanation in detail is given below of certain forms of implementation of the present invention with reference to the Drawing Figures in which same reference numerals are used to designate same or corresponding components.

Figure 2:
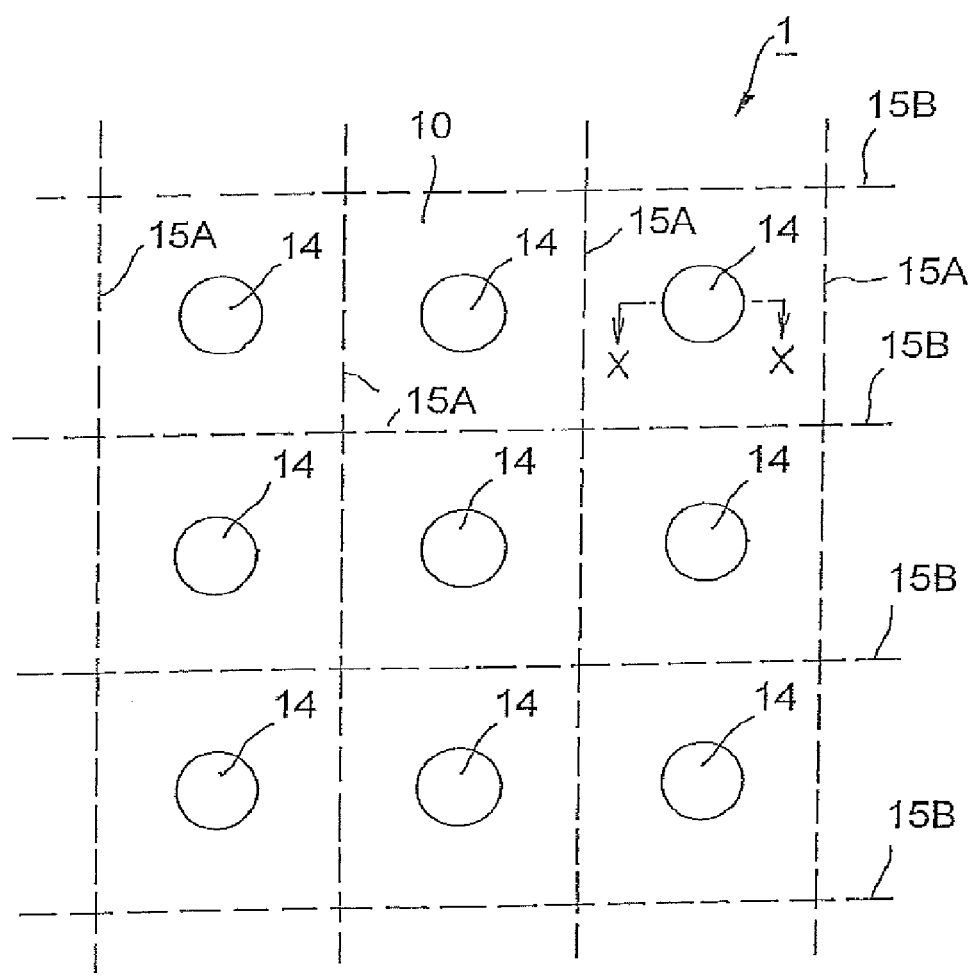
FIG. 2 is a plan view of the light emitting diode shown in FIG. 1.

FIG. 1 is a cross sectional view illustrating a structure of a vertical resonator type light emitting diode 1 according to the present invention. FIG. 2 is a plan view of the light emitting diode shown in FIG. 1. That is, a cross section taken along the line X-X in FIG. 2 is shown in FIG. 1. As shown in FIG. 1, the vertical resonator type light emitting diode 1 is formed to comprise an n-type substrate 2, a first reflector layer 3 of n type at its light reflecting side (hereinafter, referred to conveniently as "first reflector layer"), a double-heterostructure junction 7 including an n-type clad layer 4, an active layer 5 and a p-type clad layer 6, a current blocking layer 8 having an opening portion as a part thereof, a second reflector layer 9 of p type at its light emitting side (hereinafter, referred to conveniently as "second reflector layer"), an electrode layer 10 of p type disposed above the second reflector layer, and a passivation layer 13 with which the light emitting diode is covered including the electrode layer 10. When there is a current blocking layer above the p-type clad layer, the second reflector layer 9 is formed as a multilayer which in part lies in the opening portion of the current blocking layer 8 and in part lies above the opening portion and the current blocking layer 8 having the opening portion. This opening portion of the current blocking layer 8 constitutes a current passage as well as a light extracting area for the light emitting diode 1. The electrode layer 10 is formed opposite to the current blocking layer 8 across the second reflector layer 9. And, electrodes 12 and 13 are formed onto the substrate 2 and the electrode layer 10, respectively.

Here, the current blocking layer 8 is of n type or an unintentionally impurity doped layer, i.e., what is called a non-doped layer. This non-doped layer may be an i (intrinsic semiconductor) or $n^-$ layer such as semi-insulation or high resistive layer. Note also that while the substrate is mentioned as of n type, it may be a p-type substrate as of its opposite conduction type. Then, the respective conduction types of the layers can be altered in accordance with that of the substrate.

The active layer 5 in the double-heterostructure junction 7 that constitutes the light emitting area may be an active layer 22 of a quantum well structure. This active layer 22 having a quantum well structure can be a single or multiple quantum well structure formed of alternate thin semiconductor layers which are different in forbidden band gap. By optimizing such a quantum well structure, it is possible to achieve a vertical resonator type light emitting diode 1 that is higher in output power and higher in response speed than that with the single active layer 5 shown in FIG. 1.

Sandwiching the active layer 5, the first reflector layer 3 and second reflector layer 9 which are Bragg reflector layers are formed. In this case, the spacing between the first reflector layer 3 and the second reflector layer 9, namely a thickness of the double-heterostructure junction 7, corresponds to length $L_{res}$ of the vertical resonator. The length $L_{res}$ of the vertical resonator is given by equation (1) below.

$$L_{res} = (n \cdot \lambda)/(2 \cdot m_0) \quad (1)$$

where n, λ and $m_0$ are any integer, an emission wavelength of the vertical resonator type light emitting diode and a mean index of refraction of the double-heterostructure junction, respectively.

Each of the first reflector layer 3 and the second reflector layer 9 has two layers which are different in index of refraction from each other, i.e., a layer of relatively high refractive index (hereinafter referred to as "high refractive index film") and a layer of relatively low refractive index (hereinafter referred to as "low refractive index film"). The high refractive index film may have a thickness of $\lambda/(4 \cdot m_1)$ where $m_1$ is its refractive index. Likewise, the low refractive index film may have a thickness of $\lambda/(4 \cdot m_2)$ where $m_2$ is its refractive index. Each of the first reflector layer 3 and the second reflector layer 9 consists of a plurality of pairs of two alternate semiconductor layers which are different in refractive index from each other, i.e., two alternate high and low refractive index films formed one pair upon another.

In this case, if the first reflector layer 3 lying at the lower and light reflecting side is made higher in reflectance than the second reflector layer 9 lying at the upper and light emitting side, then the light emission at the active layer 5 can efficiently be emitted from the side of the second reflector layer 9. When pairs ($P_1$) of the first reflector layer 3 at the light emitting side are made greater in number than those pairs ($P_2$) of the second reflector layer 9 at the light emitting side, the light emission at the active layer 5 can be emitted from the side of the second reflector layer 9.

The present invention is characterized in that the pair number ($P_2$) of the second reflector layer 9, namely at the light emitting side is set at not more than ⅓ and not less than 1/10 of the pair number ($P_1$) of the first reflector layer 3. To wit, by setting $1/10 \leq P_2/P_1 \leq 1/3$, the vertical resonator type light emitting diode which has a small change of emission output power on the ambient temperature can be provided.

Here, if the pair number $P_2$ of the second reflector layer 9 is more than ⅓ of the pair number $P_1$ of the first reflector layer 3, it is then undesirable because the emission output power falls noticeably as the ambient temperature rises. On the other hand, when the pair number $P_2$ of the second reflector layer 9 is less than 1/10 of the pair number $P_1$ of the first reflector layer 3, then it has been found that the light amplification by resonance in the resonator is insufficient to achieve enough emission output power.

In order to increase the reflectance of the first reflector layer 3, it is desirable that the pair number therein be not less than 11 and not more than 41. If the pair number is 10.5 or less, then the light amplification brought about by resonance in the resonator becomes insufficient to achieve enough emission output power and sufficient directivity. On the other hand, if it is 41.5 or more, it has been confirmed that not only it takes longer time for crystal growth but also the dissipation of heat generated in light emission by the active layer 5 becomes insufficient so as to give rise to lowering of the emission output power.

Here, reference such as to 10.5 in describing the pair number indicates that high and refractive index films are layered in the state that there is either of them not forming a pair. For example, the pair number 10.5 mentioned above means that the first reflector layer 3 is formed of 10 pairs of high and low refractive index films plus one layer of high or low refractive index film.

In each of the first reflector layer 3 and the second reflector layer 9, a high refractive index film of $Al_rGa_{1-r}As$ (where r is a composition of Al and 0<r<1) and a low refractive index film of AlAs can be used in combination as two alternate layers. Such alternate layers formed upon another for the first reflector layer 3 and the second reflector layer 9 are indicated as $Al_rGa_{1-r}As/AlAs$.

As an alternative combination of the higher and lower refractive index layers, the low refractive index layer may be $Al_sGa_{1-s}As$ (where s is a composition of Al and $0<s<1$ and $s>r$) substituted for AlAs and the high refractive index layer may be $Al_rGa_{1-r}As$. If Al composition s in the low refractive index layer is $0.4<s<1$, Al composition r in the high refractive index layer is $0<r<0.6$ and further the relation between Al composition s in the low refractive index layer and Al composition r in the high refractive index layer is $s \geq r+0.4$, it is then possible to form a film having high reflectance.

Further, there may be interposed a buffer layer 3 between the n-type substrate 2 and the first reflector layer 3. The first reflector layer 3 that has a high crystal quality can be formed by the insertion of this buffer layer.

The vertical resonator type light emitting diode 1 may be coated over its front surface with an insulator 13 which constitutes as a passivation layer. The passivation layer 13 may be formed by depositing a silicon oxide film or silicon nitride film using a plasma CVD process. The film may have a thickness of $(n_1/4) \times (\lambda/m_3)$ where $n_1$ is an odd number and $m_3$ is a refractive index of the oxide or nitride film. The film is desirably of high transmissivity to light.

Example 1

An Example of the vertical resonator type light emitting diode 1 will be mentioned below according to the present invention. The Example 1 of the vertical resonator type light emitting diode 1 has a structure provided with the current blocking layer as shown in FIG. 1.

To begin with, in the first process step, an n-type buffer layer (not shown), a first reflector layer 3, a first clad layer 4 consisting of n-type $Al_{0.5}In_{0.5}P$, an active layer 22 consisting of a quantum well layer containing $In_xGa_{1-x}P$, a second clad layer 6 consisting of p-type $Al_{0.5}In_{0.5}P$, and a current blocking layer 8 of n-type $l_{0.5}In_{0.5}P$ are grown onto an n-type GaAs substrate 2 in this sequence thereon using the MOCVD method. These layers are the first epitaxially grown layers.

The active layer 7 had an emission wavelength of 650 nm and the thickness of clad layers 4 and 6 were designed that a resonator length is to be 652 nm. At this step, the epitaxial wafer was taken out.

In the second process step, a patterning was performed to form a light emitting window. The area of the current blocking layer 8 which is to constitute the light emitting window is locally removed, followed by rewashing.

Subsequently, the buried epitaxial growth was carried out onto the current blocking layer 8 locally formed with the light emitting window. In this second growth process, a second reflector layer 9 and a p-type GaAs electrode layer 10 having a thickness of 100 nm were grown using the MOCVD method in the same manner as in the first growth process.

Thereafter, the steps of forming an electrode 13 made of two Au and AuSbZn layers onto the epitaxial grown front surface and an electrode 12 of AuGeNi alloy onto the rear surface of the substrate, forming a passivation layer and dicing are performed to fabricate the vertical resonator type light emitting diode 1.

In Example 1, each of the first reflector layer 3 and the second reflector layer 9 was formed of a plurality of pairs of two alternate layers which were a high refractive index film of $Al_{0.45}Ga_{0.55}As$ (of 45 nm) and a low refractive index film of AlAs (of 52.5 nm). Specifically, the pair number ($P_1$) of the first reflector layer 3 was 20.5 and the pair number ($P_2$) of the second reflector layer 9 was 2.5. Then, the ratio of the pair number of the second reflector layer 9 to the pair number of the first reflector layer 3, namely $P_2/P_1$, is 1/10.

Here, the chip size is about 320 μm×320 μm and the diameter of the light emitting window 14 is 80 μm.

Example 2

A vertical resonator type light emitting diode of Example 2 was fabricated by the identical manner to that in Example 1 except that the pair number ($P_2$) of the second reflector layer 9 was 5.5. Then, the ratio of the pair number of the second reflector 9 to the pair number of the first reflector layer 3, namely $P_2/P_1$, is 5.5/20.5. This is approximately 1/4.

Comparative Example 1

Next, Comparative Example 1 will be mentioned.

A vertical resonator type light emitting diode of Comparative Example 1 was fabricated by the identical manner to that in Example 1 except that the pair number ($P_2$) of the second reflector layer 9 was 10.5. Then, the ratio of the pair number of the second reflector 9 to the pair number of the first reflector layer 3, namely $P_2/P_1$, is 10.5/20.5. This is approximately 1/2.

Table 1 below shows the pair number ($P_1$) of the first reflector layer 3, the pair number ($P_2$) of the second reflector layer 9 and their ratios to the pair number ($P_1$) of the first reflector layer 3 ($P_2/P_1$) in the vertical resonator type light emitting diodes of Examples 1 and 2 and of Comparative Example 1 as well as the temperature dependences (%/° C.) of their emission output power.

TABLE 1

| | Pair Nr ($P_1$) in the First Reflector Layer | Pair Nr ($P_2$) in the Second Reflector Layer | Pair Nr Ratio ($P_2/P_1$) | Temp. Dependence of emission output power (%/° C.) from 25° C. up to 105° C. |
|---|---|---|---|---|
| Ex. 1 | 20.5 | 2.5 | 1/10 | −0.14 |
| Ex. 2 | 20.5 | 5.5 | 1/4 | −0.21 |
| C. Ex. 1 | 20.5 | 10.5 | 1/2 | −0.64 |

Next, the emission characteristics of the vertical resonator type light emission diodes of Examples 1 and 2 and of Comparative Example 1 will be mentioned.

Figure 3:
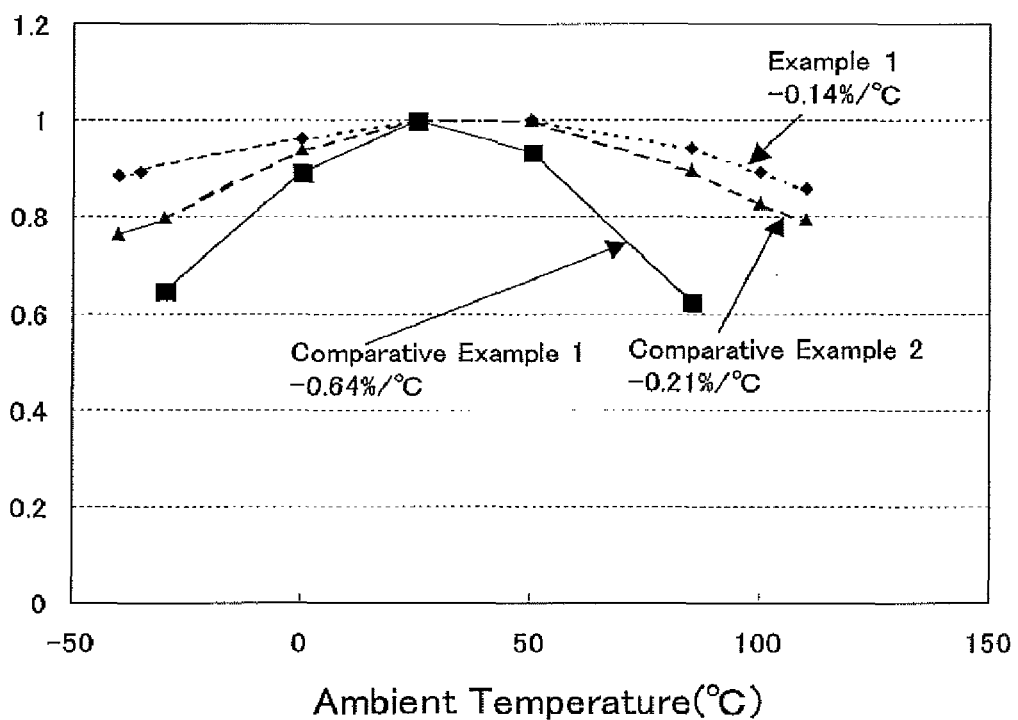
FIG. 3 is a graph illustrating dependences on the ambient temperature of the emission output power of vertical resonator type light emitting diodes in Examples 1 and 2 and Comparative Example 1.

FIG. 3 is a graph illustrating dependences on the ambient temperature of the emission output power of light emitting diodes of vertical resonator type in Examples 1 and 2 and Comparative Example 1. In FIG. 3, the abscissa axis represents the ambient temperature (° C.) and the ordinate axis represents a normalized emission output power that is normalized with an emission output power at 25° C. A flowing electric current was 10 mA. An emission output power was measured that each of the vertical resonator type light emitting diodes of Examples 1 and 2 and Comparative Example 1 was mounted onto the TO-18 stem. A value of the emission output power was measured of light transmitted through and received from a plastic fiber of 1 meter long (EskaMega, manufactured by Mitsubishi Rayon Co., Ltd.) brought proximate to the vertical resonator type light emitting diode. The emission output power was measured at each of −40° C., −30° C., 0° C., 25° C., 50° C., 80° C., 100° C. and 105° C. After the vertical resonator type light emitting diode was placed at each particular temperature and was retained isothermally for one hour, the current was flown in it. The total emission wavelength intensity was measured using a power meter. Note also that each of the light emitting diodes of vertical resonator type light emitting diode of the Examples and Comparative Example had the maximum emission intensity at a wavelength of 652 nm.

As is apparent from FIG. 3, when the ambient temperature is varied from 25° C. to 105° C. of the vertical resonator type light emitting diode in Example 1 where $P_2/P_1$ is 1/10, its emission output power decreases with a decrement of −0.14%/° C. The vertical resonator type light emitting diode of Example 2 where $P_2/P_1$ is 1/4 has a temperature dependence of −0.21%/° C. In each of them, it is seen that the drop of the emission output power as the temperature rises is small.

As for the vertical resonator type light emitting diode in Comparative Example 1 where $P_2/P_1$ is 1/2, as the ambient temperature is varied from 25° C. to 105° C., its emission output power decreases with a decrement of −0.64%/° C. and it is seen that the emission output power falls much largely as the temperature rises.

Examples 1 and 2 and Comparative Example 1 above indicate that according to the vertical resonator type in Examples 1 and 2 where the pair number of the second reflector layer 9 is 1/4 or less than the pair number of the first reflector layer 3, the temperature dependence of the emission output power is improved. It has been found that vertical resonator type light emitting diode 1 is obtained whose emission output power is resistant to declining if the temperature rises.

Example 3

Next, Example 3 will be mentioned.

A vertical resonant type light emitting diode of Example 3 was fabricated in the same manner as in Example 1 except that the pair number ($P_1$) of the first reflector layer 3 was 10.5 whereas the pair number ($P_2$) of the second reflector layer 9 was 40.5. Then, the ratio $P_2/P_1$ of the pair number ($P_2$) of the second reflector layer 9 to the pair number ($P_1$) of the first reflector layer 3 was 1/4. This is identical to the ratio in Example 2 but where the pair number ($P_1$) of the first reflector layer 3 is larger than that in Examples 1 and 2.

Comparative Example 2

Next, Comparative Example 2 will be mentioned.

A vertical resonant type light emitting diode of Comparative Example 2 was fabricated in the same manner as in Example 1 except that the pair number ($P_1$) of the first reflector layer 3 was 10.5 whereas the pair number ($P_2$) of the second reflector layer 9 was 2.5. Then, the ratio $P_2/P_1$ of the pair number ($P_2$) of the second reflector layer 9 to the pair number ($P_1$) of the first reflector layer 3 was 1/4 that is identical to the ratio in Examples 2 and 3 but where the pair number ($P_1$) in the first reflector layer 3 is smaller than that in Examples 2 and 3.

The light emitting diodes of vertical resonator type in Examples 2 and 3 and Comparative Example 2 are the same in that the ratio $P_2/P_1$ of the pair number ($P_2$) of the second reflector layer 9 to the pair number ($P_1$) of the first reflector layer 3 in each of them is 1/4, and are different from one another in varying the pair number of the first reflector layer 3. The emission output power where the forward currents is 20 mA and the temperature dependences of emission output power where the forward currents is 10 mA were measured by the same method as in Example 1, respectively. Table 2 below shows the measured emission output power and the temperature dependences of emission output power in Examples 2 and 3 Comparative Example 2, together with the pairs numbers of the first reflector layer and those of the second reflector layer as well as the ratio in pair number ($P_2/P_1$) therein. This ratio in pair number ($P_2/P_1$) is 1/4 in all of Examples 2 and 3 and Comparative Example 2.

TABLE 2

|  | Pair Nr ($P_1$) in the First Reflector Layer | Pair Nr ($P_2$) in the Second Reflector Layer | Pair Nr Ratio ($P_2/P_1$) | Emission Output @20 mA (mW) | T. Dependence of Emission Output Power@ 10 mA (%/° C.) |
|---|---|---|---|---|---|
| Ex. 2 | 20.5 | 5.5 | 1/4 | 1.78 | −0.21 |
| Ex. 3 | 40.5 | 10.5 | 1/4 | 1.63 | −0.24 |
| C. Ex. 2 | 10.5 | 2.5 | 1/4 | 1.29 | −0.31 |

As is apparent from Table 2, the pair numbers of the first reflector layers 3 of 20.5 and 40.5 in Examples 2 and 3 gave rise to emission output power of 1.78 mW and 1.63 mW, respectively.

On the other hand, when the pair number of the first reflector layer 3 is 10.5 in Comparative Example 2, the emission output power was only 1.29 mW. It was found that emission output power was sharply decreased.

When the ambient temperature is varied from 25° C. to 105° C., it has been found that temperature dependencies of emission output power are represented by −0.21%/° C. and −0.24%/° C., respectively, in Example 2 and Example 3.

On the other hand, when the ambient temperature was varied from 25° C. to 105° C. in Comparative Example 2, a temperature dependency of emission output power is −0.31%/° C. It is shown that the emission output power was decreased at the higher ambient temperature than those of the Example 2 and Example 3.

From this, it has been found that if the ratio of pair number is the same 1/4, too, the temperature dependences of emission output power in Examples 2 and 3 are lowered than that in Comparative Example 2 and that declination of the emission output power at higher ambient temperatures is improved.

Comparison of the vertical resonator type light emission diodes in Examples 2 and 3 and Comparative Example 2 shows that with the pair number in the first reflector layer 3 being 11 or more, the increased emission output power is obtained and further the temperature dependence of emission output power is improved. With the pair number of the first reflector layer 3 being 40.5 or more, though not shown in the table, it has been found as mentioned above that not only does it take longer time for crystal growth but also the dissipation of heat generated in light emission by the active layer 5 becomes insufficient so as to give rise to lowering of the emission output power.

The present invention should not be limited to the vertical resonator type light emitting diodes as mentioned in the Examples but allows various changes and modifications to be made within the scope of the present invention as defined in the appended claims. For example, the ratio of pair number of the first reflector layer 3 and the pair number of the second reflector layer 9 can, suffice to say, be suitably altered according to particular emission wavelengths and emission output power within the scope of the present invention as defined in the appended claims.

What is claimed is:

1. A vertical resonator type light emitting diode comprising:
an active layer;
a first reflector layer at a light reflecting side of said active layer, said first reflector layer having one or more pairs of films alternately disposed, one of the pair of films being a relatively high refractive index film of $Al_{0.45}Ga_{0.55}As$, the other of the pair of films being a relatively low refractive index film of AlAs; and
a second reflector layer at a light emitting side of said active layer, the first reflector layer and the second reflector layer sandwiching said active layer, said second reflector layer having one or more pairs of films alternately disposed, one of the pair of films being a relatively high refractive index film of $Al_{0.45}Ga_{0.55}As$, the other of the pair of films being a relatively low refractive index film of AlAs,
wherein the number of said pairs in said first reflector layer is not less than 11 and not more than 41, and the number of said pairs in said second reflector layer is not less than 1/10 and not more than 1/4 of the number of said pairs in said first reflector layer.

2. The vertical resonator type light emitting diode as set forth in claim 1, further comprising a passivation layer over the second reflector layer, the passivation layer having a thickness of $(n_1/4) \times (\lambda/m_3)$, where $n_1$ is an odd number, $\lambda$ is an emission wavelength of said vertical resonator type light emitting diode and $m_3$ is a refractive index of a material constituting the passivation layer, thereby yielding a high transmissivity to light of the emission wavelength.

3. The vertical resonator type light emitting diode as set forth in claim 1, wherein the number of said pairs of films in the first reflector layer is not less than 20.5 and not more than 40.5.

4. The vertical resonator type light emitting diode as set forth in claim 1, wherein the number of said pairs in the first reflector layer is 20.5, and the number of said pairs in said second reflector layer is 2.5, and
wherein a decrease in emission output power of the vertical resonator type light emitting diode when an ambient temperature is varied from 25° C. to 105° C. is about −0.14%/° C. or less.

5. The vertical resonator type light emitting diode as set forth in claim 1, wherein the number of said pairs in the first reflector layer is 20.5, and the number of said pairs in said second reflector layer is 5.5, and
wherein a decrease in emission output power of the vertical resonator type light emitting diode when an ambient temperature is varied from 25° C. to 105° C. is about −0.21%/° C. or less.

6. The vertical resonator type light emitting diode as set forth in claim 1, wherein the number of said pairs in the first reflector layer is 40.5, and the number of said pairs in said second reflector layer is 10.5, and
wherein a decrease in emission output power of the vertical resonator type light emitting diode when an ambient temperature is varied from 25° C. to 105° C. is about −0.24%/° C. or less.

* * * * *